United States Patent
Sakano et al.

(10) Patent No.: US 7,875,509 B2
(45) Date of Patent: Jan. 25, 2011

(54) MANUFACTURING METHOD OF SEMICONDUCTOR APPARATUS AND SEMICONDUCTOR APPARATUS, POWER CONVERTER USING THE SAME

(75) Inventors: Junichi Sakano, Hitachi (JP); Kenji Hara, Hitachi (JP); Shinji Shirakawa, Hitachi (JP); Taiga Arai, Mito (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 166 days.

(21) Appl. No.: 12/103,921

(22) Filed: Apr. 16, 2008

(65) Prior Publication Data

US 2008/0265331 A1    Oct. 30, 2008

(30) Foreign Application Priority Data

Apr. 18, 2007    (JP) .............................. 2007-108803

(51) Int. Cl.
*H01L 21/84*    (2006.01)
(52) U.S. Cl. .............................. 438/159; 257/E29.295; 438/151
(58) Field of Classification Search .......... 257/E29.295; 438/151, 159, 234
See application file for complete search history.

(56) References Cited

U.S. PATENT DOCUMENTS

| 5,592,014 | A | * | 1/1997 | Funaki et al. ................ 257/487 |
| 5,646,055 | A | * | 7/1997 | Tsoi ............................ 438/234 |
| 5,731,603 | A | * | 3/1998 | Nakagawa et al. .......... 257/141 |
| 5,920,087 | A | * | 7/1999 | Nakagawa et al. .......... 257/140 |
| 5,998,246 | A | * | 12/1999 | Huang et al. ................ 438/158 |
| 6,064,086 | A | * | 5/2000 | Nakagawa et al. .......... 257/335 |
| 6,150,697 | A | * | 11/2000 | Teshigahara et al. ........ 257/347 |
| 2002/0053717 | A1 | * | 5/2002 | Sumida ...................... 257/565 |
| 2005/0056906 | A1 | * | 3/2005 | Jimbo et al. ................ 257/492 |

FOREIGN PATENT DOCUMENTS

JP    10-190000    7/1998

* cited by examiner

*Primary Examiner*—Allan R Wilson
(74) *Attorney, Agent, or Firm*—Antonelli, Terry, Stout & Kraus, LLP.

(57) ABSTRACT

In a manufacturing method of a SOI type high withstand voltage semiconductor device formed on a support substrate via an insulation film, a small-sized semiconductor device having small dispersion of withstand voltage is manufactured by introducing impurities into the whole surface of a p-type or n-type SOI substrate having an impurity concentration of $2E14$ cm$^{-3}$ or less and serving as an active layer of the semiconductor device with an ion implantation method and thereby forming a drift layer.

8 Claims, 7 Drawing Sheets

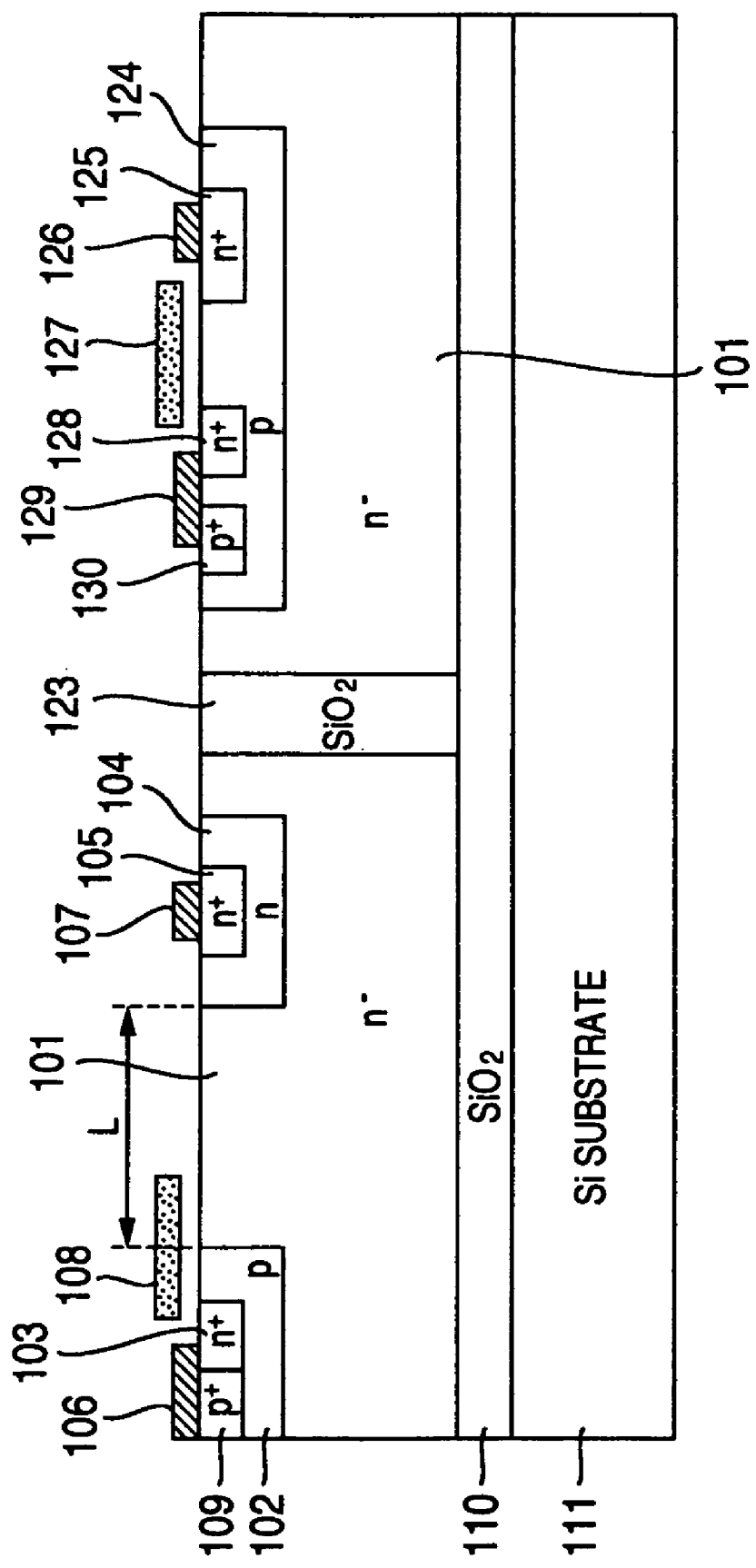

MANUFACTURING METHOD OF SEMICONDUCTOR APPARATUS AND SEMICONDUCTOR APPARATUS, POWER CONVERTER USING THE SAME

BACKGROUND OF THE INVENTION

The present invention relates to a manufacturing method of a semiconductor device which is small in size and low in loss and which can be integrated, and a power conversion circuit.

With the object of electrically isolating elements in a semiconductor integrated circuit, a SOI (Silicon on Insulator) isolation structure having an insulation film provided on side faces and a bottom part of elements to be integrated is adopted. Especially in a semiconductor integrated circuit having a withstand voltage, element isolation becomes comparatively easy and consequently the SOI isolation structure is an effective structure.

A manufacturing method of a high withstand voltage semiconductor device using such SOI isolation is disclosed in, for example, an embodiment shown in FIG. 9 in JP-A-10-190000.

A semiconductor element disclosed in JP-A-10-190000 is manufactured by implanting boron (B) into a channel region on a Si substrate insulated by an oxide film and phosphorus (P) into a drift region on the Si substrate with an ion implanter, conducting thermal diffusion, and then forming a source layer and a drain layer. Furthermore, it is aimed at minimizing the area of a pn junction between the drift region and the channel region and improving the operation withstand voltage by adding an insulation structure between the channel region and the drain region.

According to a conventional art, a manufacturing method of changing and forming p-type and n-type ion implantation regions on a p-type Si substrate and forming, for example, a channel layer and a drift layer (drift region) of a MOSFET having a high withstand voltage is disclosed. In a high withstand voltage semiconductor device manufactured by using such a method, the withstand voltage of elements typically depends upon the activated impurity concentration of the drift layer, and varies with dispersion of the impurity concentration.

Especially in a high withstand voltage semiconductor using a SOI substrate, there are relations as shown in FIG. 7 between the withstand voltage and the impurity concentration of the drift layer. There is an optimum impurity concentration which maximizes the withstand voltage. Therefore, it is necessary to provide the withstand voltage with a margin with due regard to the dispersion of the impurity concentration.

As a result of study conducted by the present inventors, however, it has been found that the dispersion rate of the withstand voltage in a high concentration region is greater than the dispersion rate in a region where the concentration is lower than the optimum value and it is necessary to set the design center value of the impurity concentration in the drift layer lower than the optimum value in order to implement the withstand voltage more stably. As a result, the resistance of the drift layer increases and the resistance of the element increases, resulting in an increase of the element size.

Furthermore, since the withstand voltage also becomes lower at the same time, it is necessary to increase the element size in order to increase the withstand voltage.

In the case of the conventional art, the drift layer is formed by using the ion implantation method, and consequently the dispersion of the impurity concentration implanted into the drift layer is narrow, and the dispersion of the withstand voltage tends to be able to be narrowed. Since the withstand voltage is affected by an influence of the impurity concentration dispersion in a start substrate, however, the above-described problem occurs in the same way.

As for the drift layer formed by using the ion implantation method, it has been found by our study that the withstand voltage becomes higher as the spread of the impurity distribution becomes greater and the impurity distribution becomes closer to that at a constant concentration. Therefore, it has been found that there is also a problem that the withstand voltage becomes low with respect to a SOI substrate obtained by using a substrate with definite impurities previously introduced into bulk Si crystal at the time of manufacture intact as the drift layer and consequently reduction of the element size becomes difficult.

In addition, in a power converter using such a semiconductor device, the large-sized semiconductor element makes large-scale integration difficult and a resultant complex circuit causes a large size. Furthermore, a problem that the efficiency of the converter is lowered by an increased loss of elements is posed.

As described above, the conventional semiconductor device has a problem that the size becomes large because of the dispersion of the semiconductor wafer. Furthermore, the power converter using the conventional semiconductor device has a problem that it is difficult to reduce the size and the efficiency is lowered.

SUMMARY OF THE INVENTION

An object of the present invention is to provide a semiconductor device reduced in size and raised in performance by preventing the dispersion of the semiconductor wafer from increasing the size of the semiconductor device, and a power converter using the semiconductor device.

In order to achieve the object, the present invention provides a manufacturing method of semiconductor device, the semiconductor device including a first semiconductor layer of a first conductivity type serving as an active layer, a second semiconductor layer of a second conductivity type formed in a first main surface of the first semiconductor layer, a third semiconductor layer of the first conductivity type formed in a surface of the second semiconductor layer, a fourth semiconductor layer of the first conductivity type formed in the first main surface of the first semiconductor layer at a distance from the second semiconductor layer, a fifth semiconductor layer of the first or second conductivity type formed at a high impurity concentration in a surface of the fourth semiconductor layer, a first electrode in contact with the second semiconductor layer and the third semiconductor layer, a second electrode in contact with the fourth semiconductor layer, a gate electrode formed so as to spread over the first, second and third semiconductor layers, and the first semiconductor layer being formed so as to have a second main surface on a support substrate via an insulation film, wherein impurities are introduced into a SOI substrate serving as the active layer of the semiconductor device by using an ion implantation method and thereby the first semiconductor layer is formed.

In order to achieve the object, the present invention provides a semiconductor device in which a high withstand voltage lateral MOSFET, a lateral IGBT and a low withstand voltage complementary MOSFET are formed on same semiconductor device by using the manufacturing method of semiconductor device.

In order to achieve the object, the present invention provides a power converter in which a high withstand voltage lateral MOSFET, a lateral IGBT and a low withstand voltage complementary MOSFET are formed on same semiconductor device by using the manufacturing method of semiconductor device.

According to the present invention, it can be realized to provide a semiconductor device reduced in size and raised in performance by preventing the dispersion of the semiconductor wafer from increasing the size of the semiconductor device, and a power conversion using the semiconductor device.

Other objects, features and advantages of the invention will become apparent from the following description of the embodiments of the invention taken in conjunction with the accompanying drawings.

BRIEF DESCRIPTION OF THE DRAWINGS

FIGS. 2A, 2B, 2C and 2D show a manufacturing method of a semiconductor device according to the present invention;

DESCRIPTION OF THE EMBODIMENTS

Hereafter, embodiments of the present invention will be described in detail with reference to the accompanying drawings.

Figure 1A:
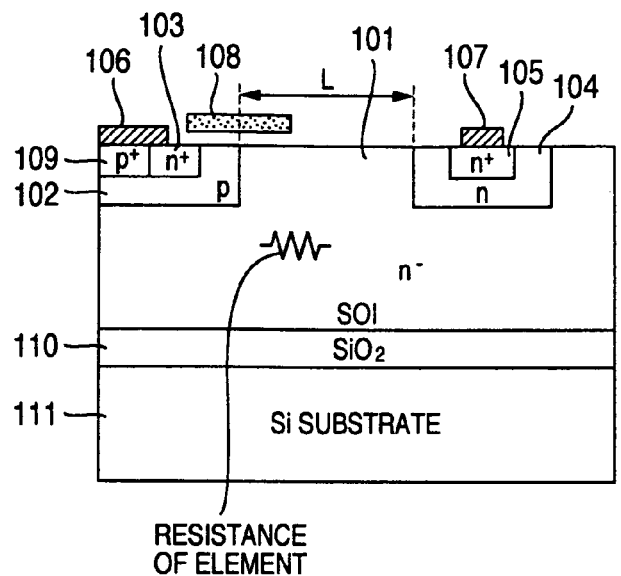
FIGS. 1A and 1B show an embodiment of a semiconductor device according to the present invention.
Figure 1B:
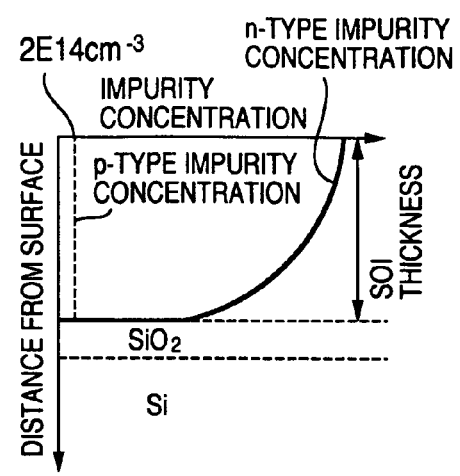

FIGS. 1A and 1B show sectional views of a semiconductor device according to the present invention, and show an example of a lateral high withstand voltage n-type MOSFET formed on a stuck SOI substrate. FIGS. 2A, 2B, 2C and 2D show a manufacturing method for forming an $n^-$ layer which serves as a drift layer of a semiconductor device according to the present invention. An n-type active Si layer 101 (SOI layer) formed over a support substrate 111 via a buried oxide film 112, a p-type channel layer 102 and an n-type punch-through stopper layer 104 formed within the active Si layer, a source $n^+$ layer 103 and a contact $p^+$ layer 109 formed within the p-type channel layer, a source electrode 106 in contact with the source $n^+$ layer and the contact $p^+$ layer, a drain $n^+$ layer 105 formed in the punch-through stopper layer from the surface, a drain electrode 107 connected to the drain $n^+$ layer, and a gate electrode 108 formed so as to spread over the source $n^+$ layer, the channel layer and the drift layer are included. A region in the active Si layer where the channel layer and the punch-through stopper layer are not formed becomes the drift layer which shares a principal part of withstand voltage of a high withstand voltage element. Impurity distribution in this region in the substrate depth direction is shown in FIG. 1B.

According to the present invention, a high resistance p-type or n-type substrate having an active layer in which the impurity concentration is $2E14$ $cm^{-3}$ or less is used as the SOI substrate of the semiconductor element at the time of manufacture, and impurities are introduced into the SOI substrate by using the ion implantation method and a method shown in FIG. 2. FIGS. 2A, 2B, 2C and 2D show processes concerning the introduction of impurities into the drift layer. Taking the case where a p-type SOI substrate is used when forming an element having a withstand voltage in the range of several tens V to 500 V according to the present invention as an example, phosphorus (P) ions having a projected range of approximately 1 μm are implanted into a p-type high resistance SOI substrate over the whole wafer surface from the surface of the SOI substrate by a high energy ion implantation method of at least approximately 2 MeV at a face density in the range of approximately $0.5E12$ $cm^{-2}$ to $3E12$ $cm^{-2}$ as shown in FIG. 2A. Impurity distribution at that time is shown in FIG. 2B.

Figure 2A:
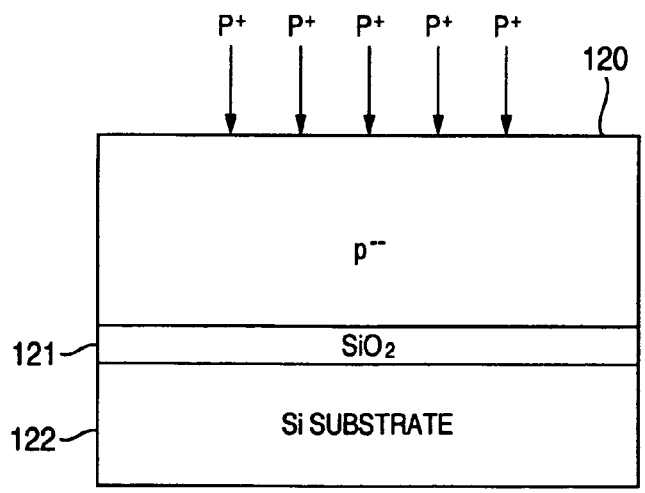
Figure 2A:
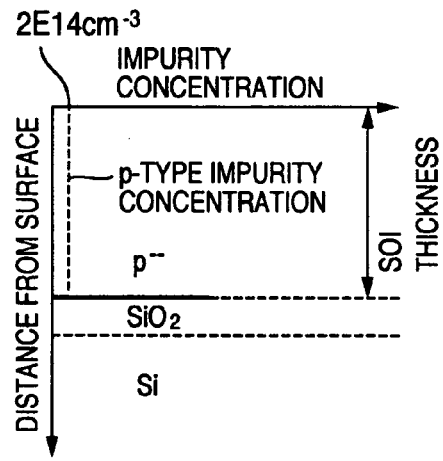
Figure 2B:
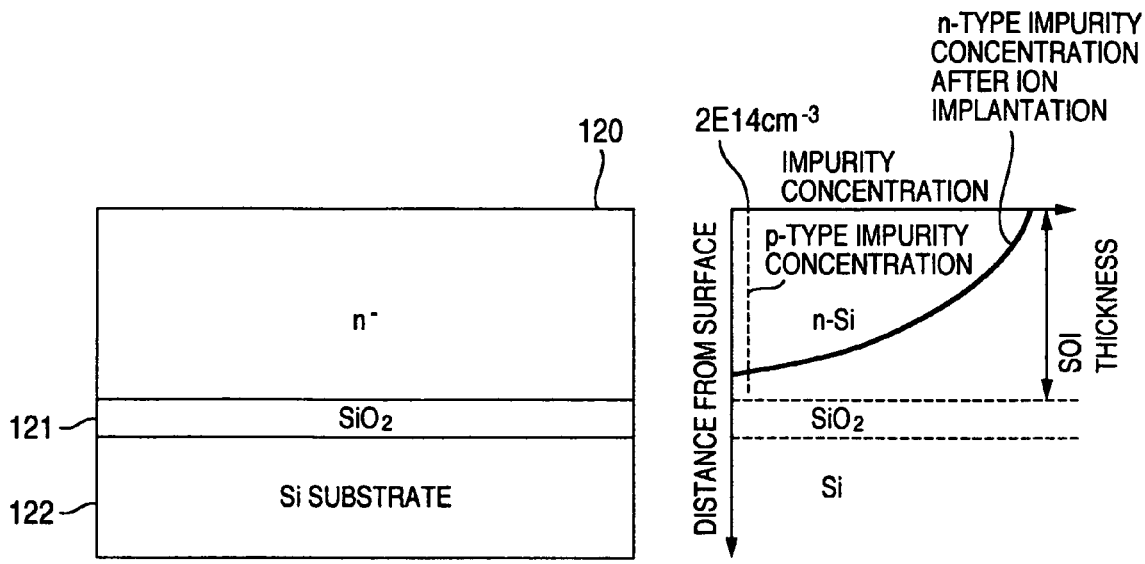
Figure 2C:
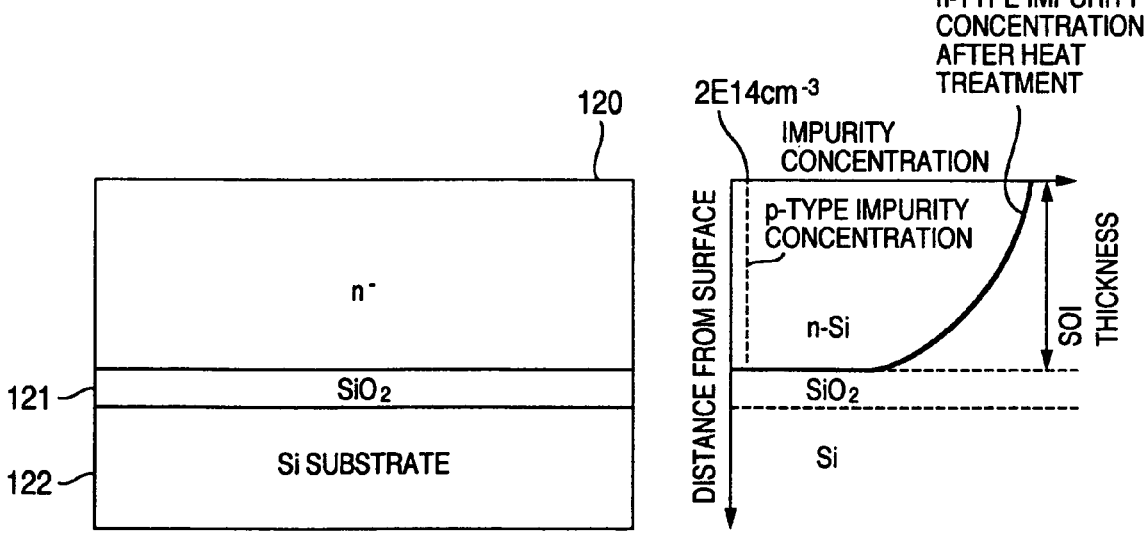

Thereafter, this wafer is subject to high temperature heat treatment, and activation and thermal diffusion of the implanted phosphorus ions are executed to form the drift layer. A change of the impurity distribution in a diffusion layer at that time is shown in FIG. 2C. Thereafter, the diffusion layer in the high withstand voltage element is formed. At the same time, a diffusion layer, a gate electrode, electrodes and wiring of a low withstand voltage integrated to the high withstand voltage element with an element isolation oxide film 123 between are formed. As represented by the structure of the whole section of the element shown in FIG. 2D, the high withstand voltage element shown on the left side and a semiconductor device having the low withstand voltage shown on the right side are manufactured mixedly.

The semiconductor device having the low withstand voltage is separated from the semiconductor device having the high withstand voltage by the element isolation oxide film 123. The semiconductor device having the low withstand voltage includes a p-well layer 124 in the active Si layer 101, and includes a drain layer 125 and a drain electrode 126. Furthermore, the semiconductor device having the low withstand voltage further includes a source electrode 129 for a source layer 128 and a p-well contact $p^+$ layer 130, and includes a gate electrode 127.

According to the present invention, a substrate having a low impurity concentration is used as the active layer. Even if dispersion of impurities occurs at the time of crystal-growing, therefore, the concentration of impurities introduced by high precision ion implantation is high and consequently the impurity concentration change in the drift layer is small and the withstand voltage change can be made small. Therefore, the source-drain distance L can be reduced, and a higher withstand voltage can be realized with a small element area. The diffusion depth of implanted impurities is made great by implanting high energy ion implantation phosphorus. And deep impurity distribution which is less in withstand voltage reduction is obtained as a result of heat treatment conducted at approximately 1000° C. for several hours. Furthermore, impurity distribution of phosphorus which is uniform in the wafer face and in the depth direction and which is less in dispersion can be realized. Even if ion implantation into the whole surface of the wafer is conducted, therefore, there is no influence on the dispersion of carrier distribution of other diffusion layers and performance of other elements can also be stabilized. Therefore, it is not necessary to separate ion implantation regions in the $n^-$ layer serving as the drift layer and other element regions, and the photolithography process can also be reduced. The present invention is suitable to a structure having a thick SOI layer which is high in withstand voltage and which can be remarkably improved in withstand voltage by making the impurity distribution in the drift layer deep. It is suitable to have a configuration which is at least 4 µm in SOI thickness.

Figure 3A:
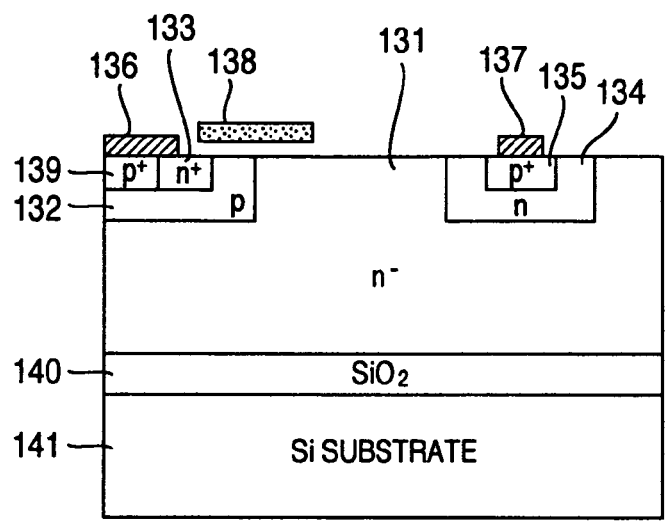
FIGS. 3A and 3B show another embodiment of a semiconductor device according to the present invention.
Figure 3B:
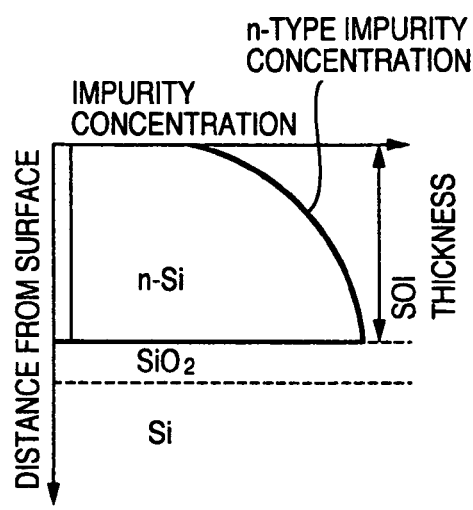
Figure 4A:
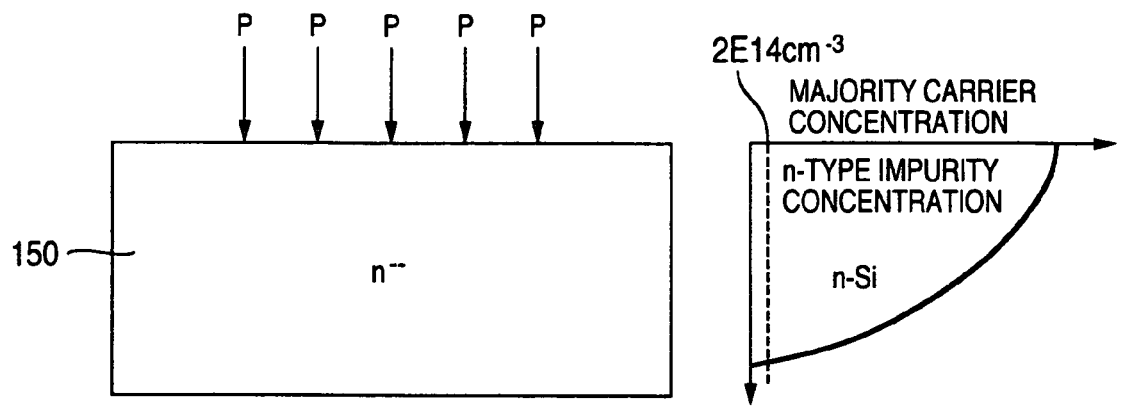
FIGS. 4A and 4B show another embodiment of a semiconductor device manufacturing method according to the present invention.
Figure 4B:
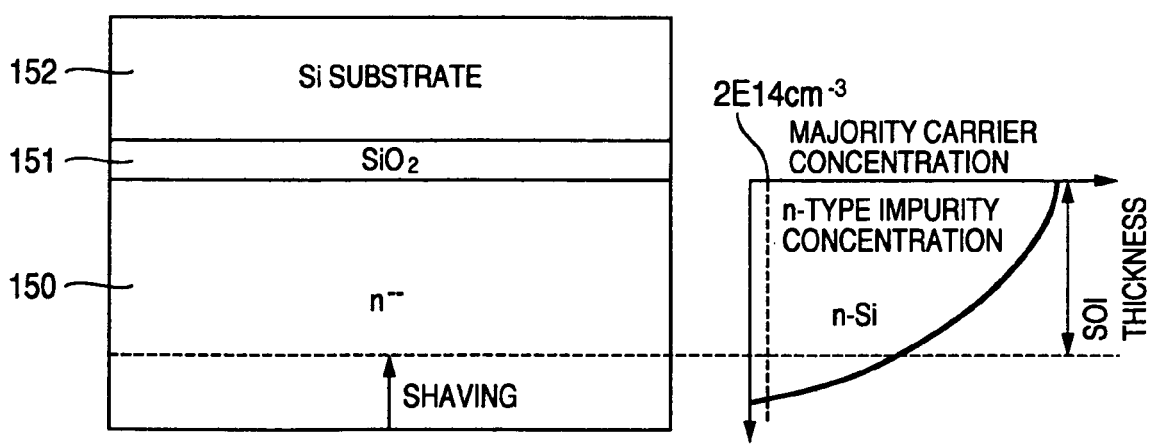

FIGS. 3A, 3B, 4A and 4B show another embodiment of the present invention with respect to the case of a lateral IGBT. FIGS. 3A and 3B show an element structure and impurity distribution in a drift layer, and FIGS. 4A and 4B show its manufacturing method.

In the configuration shown in FIGS. 3A and 3B, an n-type active Si layer 131 formed over a Si support substrate 141 via a buried oxide film 140, a p-type channel layer 132 and an n-type punch-through stopper layer 134 formed within the active Si layer, a source $n^+$ layer 133 and a contact $p^+$ layer 139 formed within the p-type channel layer 132, an emitter electrode 136 in contact with the $n^+$ layer and the $p^+$ layer, a collector $p^+$ layer 135 formed in the punch-through stopper layer from the surface, a collector electrode 137 connected to the collector $p^+$ layer 135, and a gate electrode 138 formed so as to spread over the $n^+$ layer, the channel layer and the drift layer are included. A region in the active Si layer where the channel layer and the punch-through stopper layer are not formed becomes the drift layer which shares a principal part of withstand voltage of a high withstand voltage element. Impurity distribution in this region in the substrate depth direction is shown in FIG. 3B.

FIGS. 4A and 4B show a case where a semiconductor device is manufactured by using a SOI substrate which uses an n-type high resistance substrate as the substrate. As for the manufacturing method in this case, first, P ions are implanted into the whole wafer surface from one surface of an n-type high resistance Si substrate 150 shown in FIG. 4A by using the ion implantation method. Activation and thermal diffusion are executed by conducting heat treatment. Distribution of P at this time is also shown in FIG. 4A.

Thereafter, the Si substrate 150 and a silicon support substrate 152 having an oxide film 151 provided on its surface are stuck to each other as shown in FIG. 4Bm and they are joined by heat treatment. By the way, the oxide film 151 may be provided on the Si substrate 150. In addition, the Si substrate 150 is shaved in the range of 4 to 10 and several µm from the surface opposite from the surface through which P ions have been implanted. As a result, a SOI substrate having the Si substrate 150 as a SOI layer can be formed. A diffusion layer, a gate electrode, electrodes and wiring are formed on the surface of the SOI substrate thus formed. Thus, it can be implemented to manufacture a high withstand voltage shown in FIGS. 3A and 3B.

The present invention is the same as the preceding embodiment in that high energy ions having large projected ranges are implanted into the whole surface of a high resistance substrate. However, the present invention is different from the preceding embodiment in that phosphorus ions are implanted from the face to be stuck to the buried oxide film before being stuck to the SOI support substrate, the substrate is shaved after the sticking and a high withstand voltage element is formed on the SOI substrate made to have the desired SOI thickness. In the manufacturing method according to the present invention, the impurity distribution in the drift layer increases as the location advances form the main surface to the buried oxide film.

In the case where a high withstand voltage MOSFET is formed, electric field strength obtained in a direction from the drain toward the buried oxide film when a voltage is applied between the drain and source can be reduced as compared with the embodiment shown in FIGS. 1A and 1B owing to the impurity distribution described above. As a result, a higher withstand voltage can be realized, and it becomes possible to reduce the element size and the element resistance. Needless to say, if the IGBT is formed as shown in FIGS. 3A and 3B, the electric field strength in the direction from the collector toward the buried oxide film is reduced and similar effects are obtained.

Figure 5A:
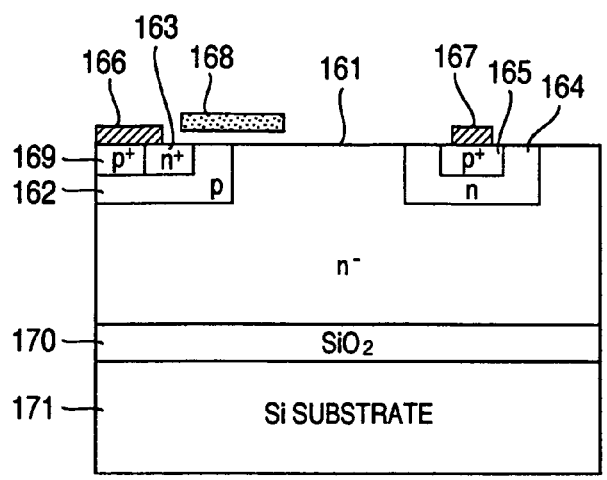
FIGS. 5A and 5B show still another embodiment of a semiconductor device according to the present invention.
Figure 5B:
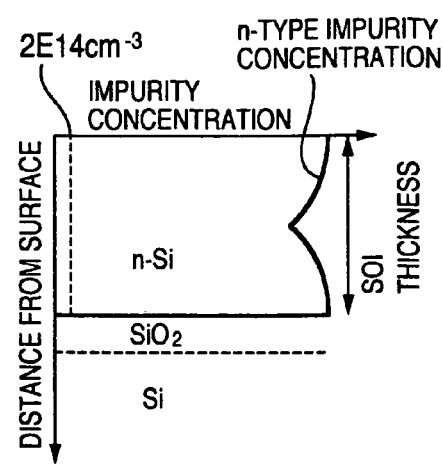

FIGS. 5A and 5B show an embodiment of a lateral IGBT as a semiconductor device manufactured by combining the manufacturing method shown in FIGS. 1A and 1B with the manufacturing method shown in FIGS. 3A and 3B. FIG. 5A shows an element structure. Respective layer structures in this element structure have the same configurations as those shown in FIG. 3A. FIG. 5B shows impurity distribution in the drift layer.

In the present embodiment, a high withstand voltage element is formed on a substrate subjected to thermal diffusion by ion-implanting P from a sticking face of a SOI substrate 161 serving as an active layer before SOI sticking, shaving the SOI substrate 161 to attain a desired SOI thickness, and ion-implanting P into the whole wafer surface from the SOI surface. According to the present method, the impurity distribution becomes as shown in FIG. 5B. Even if the withstand voltage is higher and the SOI thickness of the SOI substrate is thicker, uniform concentration distribution in the drift layer can be realized. As a result, a high withstand voltage with little dispersion can be obtained.

Heretofore, the embodiments of the present invention have been described with reference to the MOSFET or IGBT having a high withstand voltage. Needless to say, manufacturing methods in respective embodiments have similar effects for both elements.

Figure 6:
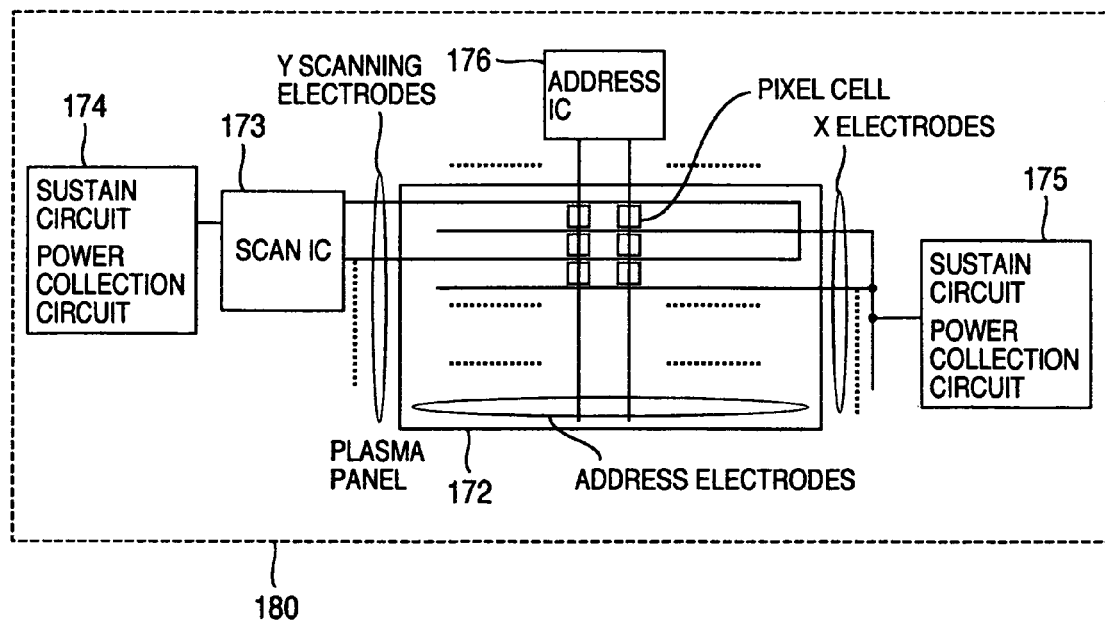
FIG. 6 shows an embodiment of a power converter for a plasma panel display configured by using a semiconductor device according to the present invention.
Figure 7:
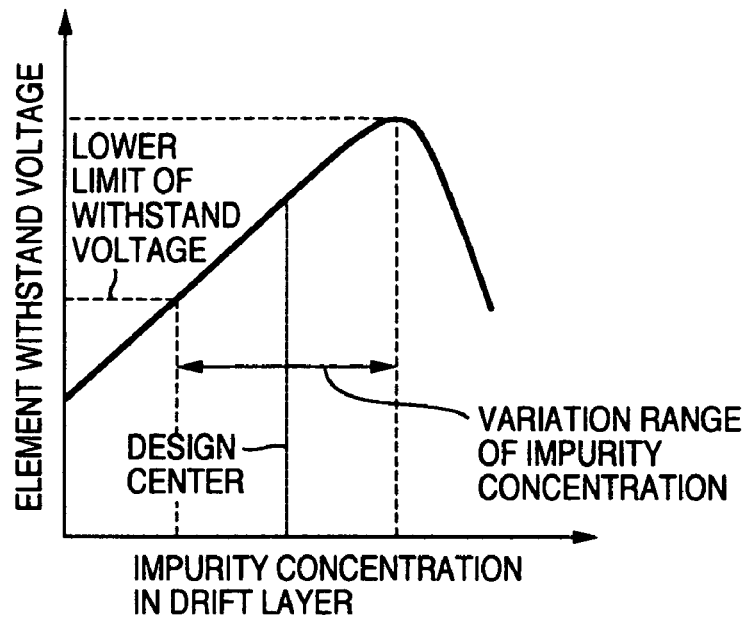
FIG. 7 shows an example of a relation between a drift layer impurity concentration and a withstand voltage of a semiconductor device formed on a dielectric insulation substrate.
Figure 8:
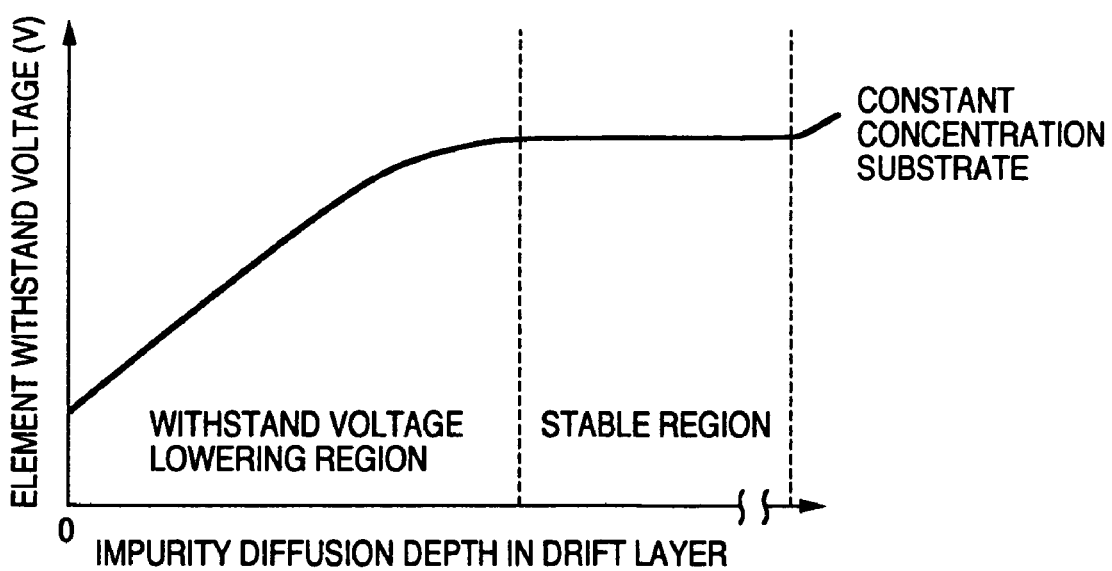
FIG. 8 shows an example of a relation between drift layer impurity concentration distribution and a withstand voltage of a semiconductor device formed on a dielectric insulation substrate.

FIG. 6 shows an example in which a plasma panel display serving as a power converter is formed by using a semiconductor device manufactured by using the semiconductor device manufacturing method according to the present invention.

In this embodiment, a plasma panel unit 180 includes address electrodes 172 contained in a plasma panel 172 and driven by an address IC 176, Y scanning electrodes driven by a sustain circuit 174 via a scan IC 173, and X electrodes driven by a sustain circuit 175. Semiconductor devices having withstand voltages in the range of approximately 100 V to 600 V are used in the address IC 176, the scan IC 173, and the sustain circuits 174 and 175 included in the plasma panel unit 180. By using semiconductor devices which are small in size and low in loss, it becomes possible to integrate a plurality of semiconductor devices in use, reduce the size relying upon, for example, unification of semiconductor devices differing in function, and improve the luminous efficacy which is the power conversion efficiency.

According to the present invention, it is possible to provide a semiconductor device reduced in size and raised in performance by preventing the dispersion of the semiconductor wafer from increasing the size of the semiconductor device, and a power converter, as heretofore described.

As heretofore described, it is possible according to the present invention to provide a semiconductor device reduced in size and raised in performance by preventing the dispersion of the semiconductor wafer from increasing the size of the semiconductor device, and a power converter using these semiconductor devices.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A manufacturing method of semiconductor device, the semiconductor device comprising:
   a first semiconductor layer of a first conductivity type formed as an SOI substrate serving as an active layer;
   a second semiconductor layer of a second conductivity type formed in a first main surface of the first semiconductor layer;
   a third semiconductor layer of the first conductivity type formed in a surface of the second semiconductor layer;
   a fourth semiconductor layer of the first conductivity type formed in the first main surface of the first semiconductor layer at a distance from the second semiconductor layer;
   a fifth semiconductor layer of the first or second conductivity type formed in a surface of the fourth semiconductor layer, wherein the fifth semiconductor layer has a higher impurity concentration than the fourth semiconductor layer;
   a first electrode in contact with the second semiconductor layer and the third semiconductor layer;
   a second electrode in contact with the fourth semiconductor layer;
   a gate electrode formed so as to spread over the first, second and third semiconductor layers; and
   the first semiconductor layer being formed so as to have a second main surface on a support substrate via an insulation film,
   wherein impurities are introduced into the SOI substrate serving as the active layer of the semiconductor device by using an ion implantation method and thereby the first semiconductor layer is formed, and
   wherein, in the SOI substrate serving as the active layer, a concentration of p-type or n-type impurities is 2E14 $cm^{-3}$ or less.

2. The manufacturing method of semiconductor device according to claim 1, wherein:
   impurities are introduced from a Si face side of a Si layer serving as an active layer of the SOI substrate which is opposite from the first main surface and which is in contact with an insulator by using an ion implantation method to form the first semiconductor layer.

3. A semiconductor device, wherein a high withstand voltage lateral MOSFET, a lateral IGBT and a low withstand voltage complementary MOSFET are formed on same semiconductor device by using the manufacturing method of semiconductor device according to claim 1.

4. A power converter, wherein a high withstand voltage lateral MOSFET, a lateral IGBT and a low withstand voltage complementary MOSFET are formed on same semiconductor device by using the manufacturing method of semiconductor device according to claim 1.

5. A manufacturing method of semiconductor device and the semiconductor device comprising:
   a first semiconductor layer of a first conductivity type formed as an SOI substrate serving as an active layer;
   a second semiconductor layer of a second conductivity type formed in a first main surface of the first semiconductor layer;
   a third semiconductor layer of the first conductivity type formed in a surface of the second semiconductor layer;
   a fourth semiconductor layer of the first conductivity type formed in the first main surface of the first semiconductor layer at a distance from the second semiconductor layer;
   a fifth semiconductor layer of the first or second conductivity type formed in a surface of the fourth semiconductor layer, wherein the fifth semiconductor layer has a higher impurity concentration than the fourth semiconductor layer;
   a first electrode in contact with the second semiconductor layer and the third semiconductor layer;
   a second electrode in contact with the fourth semiconductor layer;
   a gate electrode formed so as to spread over the first, second and third semiconductor layers; and
   the first semiconductor layer being formed so as to have a second main surface on a support substrate via an insulation film,
   wherein impurities of an n-type or a p-type are introduced into the SOI substrate serving as the active layer of the semiconductor device by using an ion implantation method and thereby the first semiconductor layer is formed, wherein:
   impurities are introduced from the first main surface into a whole surface of the substrate by using an ion implantation method to form the first semiconductor layer, and
   a projected range of implantation of the ion kind is at least 1 μm.

6. The manufacturing method of semiconductor device and the semiconductor device according to claim 5, wherein:
   a Si layer serving as an active layer of the SOI substrate has a thickness of at least 4 μm.

7. A semiconductor device, wherein a high withstand voltage lateral MOSFET, a lateral IGBT and a low withstand voltage complementary MOSFET are formed on same semiconductor device by using the manufacturing method of semiconductor device according to claim 5.

8. A power converter, wherein a high withstand voltage lateral MOSFET, a lateral IGBT and a low withstand voltage complementary MOSFET are formed on same semiconductor device by using the manufacturing method of semiconductor device according to claim 5.

* * * * *